United States Patent [19]

Meaney et al.

[11] Patent Number: 5,774,481
[45] Date of Patent: Jun. 30, 1998

[54] REDUCED GATE ERROR DETECTION AND CORRECTION CIRCUIT

[75] Inventors: Patrick James Meaney, Poughkeepsie; Chin-Long Chen, Fishkill, both of N.Y.

[73] Assignee: International Business Machines Corporation, Armonk, N.Y.

[21] Appl. No.: 414,064

[22] Filed: Mar. 31, 1995

[51] Int. Cl.[6] .................................................. H03M 13/00
[52] U.S. Cl. .......................................................... 371/40.1
[58] Field of Search ................................. 321/40.1, 40.2, 321/3

[56] References Cited

U.S. PATENT DOCUMENTS

| | | | |
|---|---|---|---|
| 3,623,155 | 11/1971 | Hsiao | 371/37.1 |
| 4,319,357 | 3/1982 | Bossen | 371/37.2 |
| 4,466,099 | 8/1984 | Meltzer | 371/47.1 |
| 4,740,968 | 4/1988 | Aichelmann, Jr. | 371/3 |
| 4,817,095 | 3/1989 | Smelser et al. | 371/40.1 |
| 4,888,773 | 12/1989 | Arlington et al. | 371/40.2 |
| 4,974,147 | 11/1990 | Hanrahan et al. | 395/182.22 |
| 5,027,357 | 6/1991 | Yu et al. | 371/37.7 |
| 5,157,669 | 10/1992 | Yu et al. | 371/37.7 |
| 5,172,381 | 12/1992 | Karp et al. | 371/42 |
| 5,228,046 | 7/1993 | Blake et al. | 371/38.1 |
| 5,241,546 | 8/1993 | Peterson et al. | 371/37.1 |
| 5,299,208 | 3/1994 | Blaum et al. | 371/38.1 |
| 5,313,475 | 5/1994 | Cromer et al. | 371/40.1 |
| 5,491,702 | 2/1996 | Kinsel | 371/37.2 |

FOREIGN PATENT DOCUMENTS 55-162162  12/1980  Japan .
2-41572    2/1990   Japan .
58-144953  8/1993   Japan .

OTHER PUBLICATIONS

"Roll–Mode Error Correction", IBM Technical Disclosure Bulletin, vol. 24, No. 1A, Jun. 1981, pp. 166–171.
"Consecutive Error Correction", IBM Technical Disclosure Bulletin, vol. 24, No. 11B, Apr. 1982, pp. 6048–6049.
"Error Checking for a Full Carry Look–ahead Adder", IBM Technical Disclosure Bulletin, vol. 27, No. 10B, Mar. 1985, pp. 6241–6248.
"Fully Self–contained Memory Card Extended Error Checking/Correcting Hardware Implementation", IBM Technical Disclosure Bulletin, vol. 31, No. 5, Oct. 1988, pp. 352–355.

Primary Examiner—Stephen M. Baker
Attorney, Agent, or Firm—Lynn L. Augspurger

[57] ABSTRACT

Error detection and correction circuitry, optimized to reduce the time required to correct single errors and to detect the presence of uncorrectable errors, uses an optimized H-Matrix and provides reduced logic circuitry. Correctable error syndromes are defined as comprising an odd number of ones and an uncorrectable-error detection circuit generates an uncorrectable-error indication when an even number of ones are detected. The correctable-error syndromes are defined as having a predefined combination of ones and zeros in each of a set of corresponding bit positions and different combinations of ones and zeros in other bit position. An error syndrome comprising only zeros is designated as indicative of a no error condition. Logic circuitry is provided which implements the error detection and correction circuitry with a reduced set of logic gates.

12 Claims, 5 Drawing Sheets

REDUCED GATE ERROR DETECTION AND CORRECTION CIRCUIT

BACKGROUND OF THE INVENTION

1. Field of the Invention

The invention relates to error detection and correction circuitry in data processing systems and more particularly to logic circuitry for detecting correctable and uncorrectable errors using an H-matrix.

2. Background Art

To ensure the integrity of data stored in a data processing system and transmitted between various parts of the system, various error detection and correction schemes have been employed. Known schemes, such as the Hamming code, allow for double error detection and single error correction. Typically, before a data word is stored in a memory, check bits are generated over the data bits and stored with the data word. When the data word is retrieved from memory, a check is made over the data and the check bits to detect and, if necessary, to correct identifiable bits. In checking the data word and error bits received from memory, a syndrome is generated for each parity group of a multiple byte data word. A matrix, referred to as an H-matrix, may be generated which defines all of the syndromes for which a single error is correctable and which identifies each bit position of the data word which is correctable. When a syndrome is generated which matches the data in one of the columns of the matrix, the bit to be corrected is identified from the matrix and the polarity of the identified bit is changed to correct the data error. Additional tests need to be made to determine whether there are uncorrectable errors. When dealing with 64-bit data words, the H-matrix has 64 columns, plus columns for check bits. The number of syndromes which may be generated and which do not fall within the matrix are considerably larger than the correctable-error syndromes included in the matrix. A typical error correction scheme using 8-bit syndromes for 64 bits of data, and requiring single error correction and double error detection, will have 256 possible syndromes and 72 syndromes associated with correctable errors. The detection of the presence of a correctable error and the presence of uncorrectable errors requires large amounts of detection circuitry adding considerably to the cost of the system.

SUMMARY OF THE INVENTION

In accordance with this invention, error detection and correction circuitry is optimized to reduce the time required to correct single errors and to detect the presence of uncorrectable errors. A system in accordance with the principles of the invention uses an optimized H-matrix and provides reduced logic circuitry taking advantage of the particular characteristics of the H-matrix.

In accordance with one aspect of the invention, the correctable-error syndromes comprise an odd number of ones and the uncorrectable-error detection circuit is responsive to a syndrome having an even number of ones to generate an uncorrectable-error indication. In accordance with another aspect of the invention, the correctable-error syndromes are defined as having predefined combinations of ones and zeros in a set of corresponding bit positions and differing combinations of ones and zeros in other bit positions and a correctable-error detection circuit comprises decode circuitry for decoding bits in the set of the corresponding bit positions to detect correctable error syndromes.

In accordance with a further aspect of the invention, a subset of the correctable-error syndromes has pre-defined identical combinations of ones and zeros in a first set of corresponding bit positions e.g. syndrome hits of rows 0–3 of each column of data bit columns 0–31, and rows 4–7 of data bit columns 32–63 as illustrated in the H-Matrix Table A herein all have an identical same number of zeros and ones as illustrated by two ones and two zeros, and differing combinations of ones and zeros, comprising an odd number of ones, e.g. syndrome bits of rows 4–7 of each column of data bit columns 0–31, and rows 0–3 of data bit columns 32–63 as illustrated in the H-Matrix Table A herein all have an different combination of zeros and ones with this subset of syndrome bits having a different (odd) number of bits of one value Table A herein, in a second set of corresponding bit positions and a correctable-error detection circuit comprises a decode circuit for detecting the pre-defined identical combinations of ones and zeros in the first subset and a second circuit for detecting an odd number of ones in the second subset. Advantageously, the logic circuitry for detecting correctable errors is reduced considerably from prior art arrangements when the correctable-error syndromes are defined in accordance with the system of the invention. In a particular embodiment of the invention, the set of correctable-error syndromes includes syndromes having a pre-defined identical combination of ones and zeros in the second set of corresponding bit positions and differing combinations of ones and zeros, comprising a odd number of ones, in the first set of corresponding bit positions. Advantageously, a large number of error syndromes may be decoded with a readily repeatable and simplified detection scheme.

In accordance with another aspect of the invention, an error syndrome comprising only zeros is designated as indicative of a no error condition and the system comprises a zero detect circuit as well as an uncorrectable-error detect circuit and a correctable-error detect circuit and an orthogonality detection circuit generating an error signal if not one and only one of these detect circuits generates an output signal. Advantageously, the orthogonality circuit provides a means for detecting errors in the error detection and correction circuitry.

In accordance with another aspect of the invention, error correction circuitry is responsive to correctable-error syndromes and comprises a plurality of output gates each providing an error correction output signal and a first de-coder circuit decoding pre-defined identical combinations of ones and zeros in a pre-defined subset of corresponding bit positions and a second de-coder for decoding the combinations of ones and zeros in another set of corresponding bit positions. In accordance with a further aspect of the invention, the system comprises bit plurality determination circuitry connected to the syndrome generator and generating an error signal when the parity over the syndrome is other than a pre-defined parity, thereby providing a further check over the syndrome generator circuitry.

BRIEF DESCRIPTION OF THE DRAWINGS

The invention will now be described with reference to the drawings wherein.

DETAILED DESCRIPTION

Figure 1:
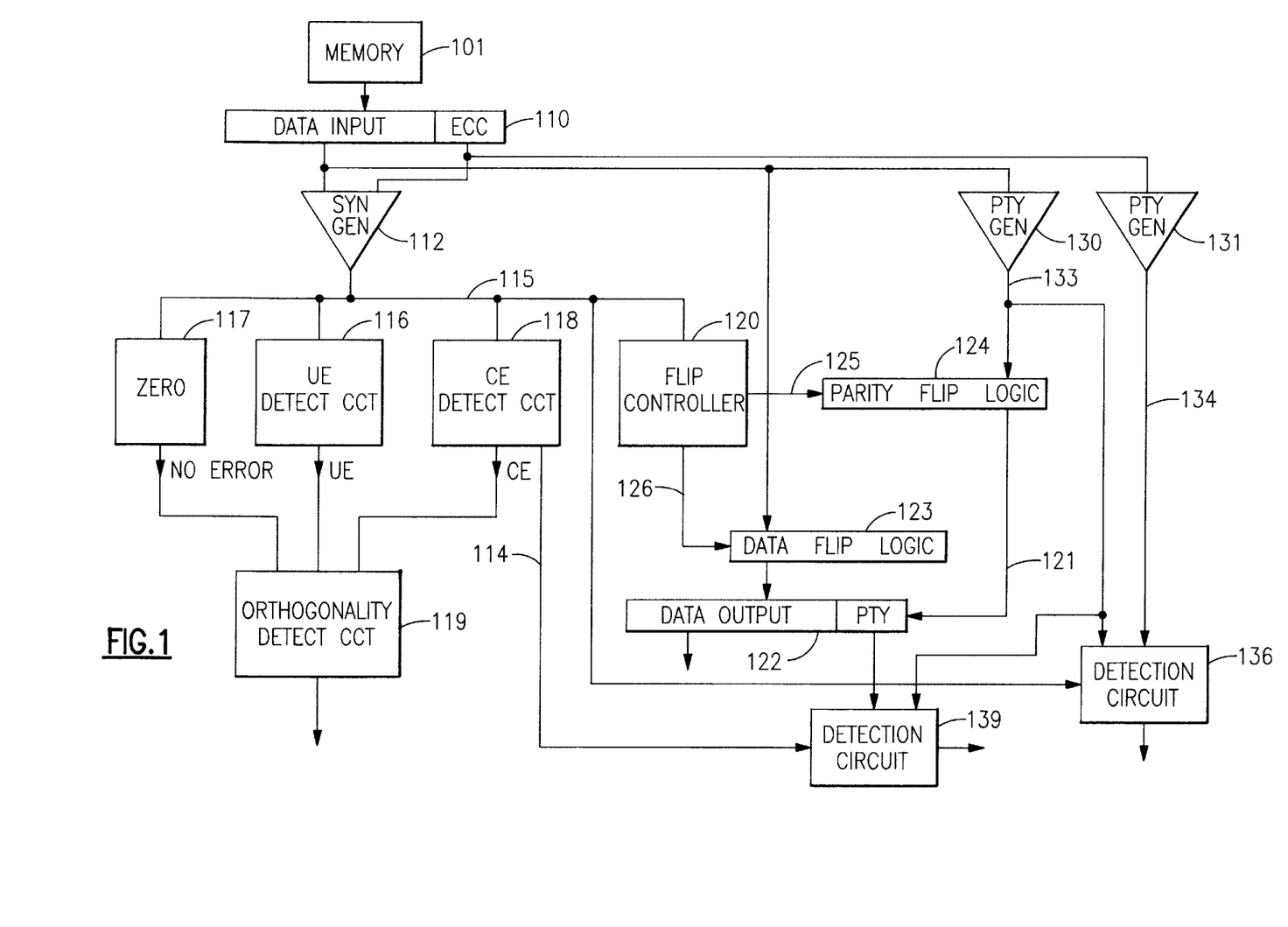
FIG. 1 is a block diagram representation of error detection and correction circuitry incorporating principles of the invention.

FIG. 1 is a block diagram representation of error detection and correction circuitry incorporating principles of the invention. FIG. 1 includes a data input register 110 in which data and an error control code (ECC) are received from a memory 101 in a standard memory read operation. For the purposes of error detection and correction, a syndrome is generated by means of a well known syndrome generator 112. The output of the syndrome generator 112 is connected via a bus 115 to an uncorrectable-error (UE) detection circuit 116, a zero detect circuit 117, a correctable-error (CE) detection circuit 118, and a flip controller 120. The zero detect circuit 117 provides an output when syndrome consists of all zeroes, which has been defined in the present system as a no-error condition. The outputs of the zero detect circuit 117, the UE detect circuit 116, and the CE detect circuit 118 may be tested for orthogonality, i.e. that one and only one of these three circuits generates an output signal for each tested syndrome, in orthoganality detect circuit 119.

Circuit 119 may be standard logic circuit generating an error output when if the orthogonality condition is not satisfied. The data input register 110 also is connected to data flip logic 123. The flip controller 120 decodes the syndrome obtained from the bus 115 and generates an appropriate output when the syndrome indicates a single, correctable error in a bit location of the data in memory register 110. The output of flip controller 120 is used to change the polarity of a specific bit identified by the syndrome in order to correct the data in the data flip logic 123. The corrected output of flip logic 123 is gated to the data output register 122.

When data is written into memory a new error correction code is generated by means of a check bit generation circuit (not shown in the drawing). The check bit generation circuit and the syndrome generator 112 typically comprise a group of parity generators, e.g. exclusive-nor (XNOR) circuits. The generated check bits are stored in memory with the data word. When the data word is again retrieved from memory, the data and the accompanying ECC code is stored in the data input register 110. The syndrome generator 112 is a well-known circuit and is essentially a check bit generator which operates on the data and the ECC bits to generate the syndrome. A pair of parity generators 130, 131 are connected between data input register 110. The parity generator 130 generates byte parity over each of the 8 bytes of a 64-bit input data word and parity generator 131 generates parity over the 8 bit error correction code received from memory in the data input register 110. The output of the byte parity generator 130 is connected to a parity flip logic 124 via byte parity bus 133. The parity flip logic 124 is connected via a plurality of input conductors 125 to the flip controller 120. In the event that the polarity of one of the parity bits needs to be reversed, a signal from flip controller 120 on one of the conductors 125 changes the appropriate bit in the flip parity logic 124. The output of the flip parity logic 124 is stored in the parity position of the data output register 122 via conductor 121.

The ECC parity generated on busses 133 and 134 by parity generators 130 and 131, respectively, and the syndrome on syndrome bus 115 are transmitted to a detection circuit 136. The purpose of the detection circuit 136 is to perform a crosscheck of the syndrome generator 112. In a similar fashion, detection circuit 139, connected to the parity output of register 122, parity generator 130, and a data output of CE detect circuit 118 on conductor 114, provides a cross-check of the parity flip logic 124 and CE detect circuit 118. As described later herein with reference to FIG. 3, the output of CE detect circuit 118 on conductor 114 represents data CE only. Additionally, the data flip logic 123 can be cross-checked using a byte parity check across data output register 122.

TABLE A

H-MATRIX

```
                 0000000000111111111122222222223333333333444444444455555555556666  ECC
                 0123456789012345678901234567890123456789012345678901234567890123  01234567

0  1111111100000000000000001111111110001101000111010001110100001110  10000000
1  1111111111111110000000000000000010011010100110101001101010001101  01000000
2  0000000111111111111111100000000001010110010101100101011001010110  00100000
3  0000000000000000111111111111111110001011100010111000101110001011  00010000
4  1000111010001110100011101000111011111111000000000000001111111111  00001000
5  0100110101001101010011010100110111111111111111111000000000000000  00000100
6  0010101100101011001010110010101100000000111111111111111100000000  00000010
7  0001011100010111000101110001011100000000000000001111111111111111  00000001
```

Table A is a tabular representation of an H-matrix for a single error correcting/double error detecting (SEC/DED) code for protecting a data word of 64 bits with 8 check bits. The basic properties and implementation of the H-matrix are well known to those skilled in the art and a number of different H-matrices may be generated within specified constraints, such as the minimum number of check bits required for a selected number of data bits for single error detection and correction. For double error detection, an additional check bit is required. In the H-matrix shown in Table A, 8 check bits are used to provide single error correction and double error detection over 64 data bits plus 8 error control bits. The particular matrix configuration of Table A employs a specific pattern of 1's and 0's with certain recurring subpatterns which are used to advantage, in accordance with this invention, in constructing the circuitry for error detection, as described further in subsequent paragraphs. Each column of the H-matrix represents a syndrome for a single correctable error in the bit position corresponding to the position of the column in the matrix. In Table A, the bit positions are indicated by decimal numbers in alignment with the columns. The number of columns in the matrix corresponds directly to the number of positions in the data word, i.e. 64. Each row of the syndrome matrix represents a parity group. Each parity group includes the indicated data bit positions and the corresponding check bit. An adjacent 8 by 8 error matrix contains a parity bit for a row of the syndrome matrix in a corresponding row in the parity matrix. Each column of the syndrome matrix contains an 8-bit syndrome for a corresponding bit position of the 64-bit data word.

Figure 2:
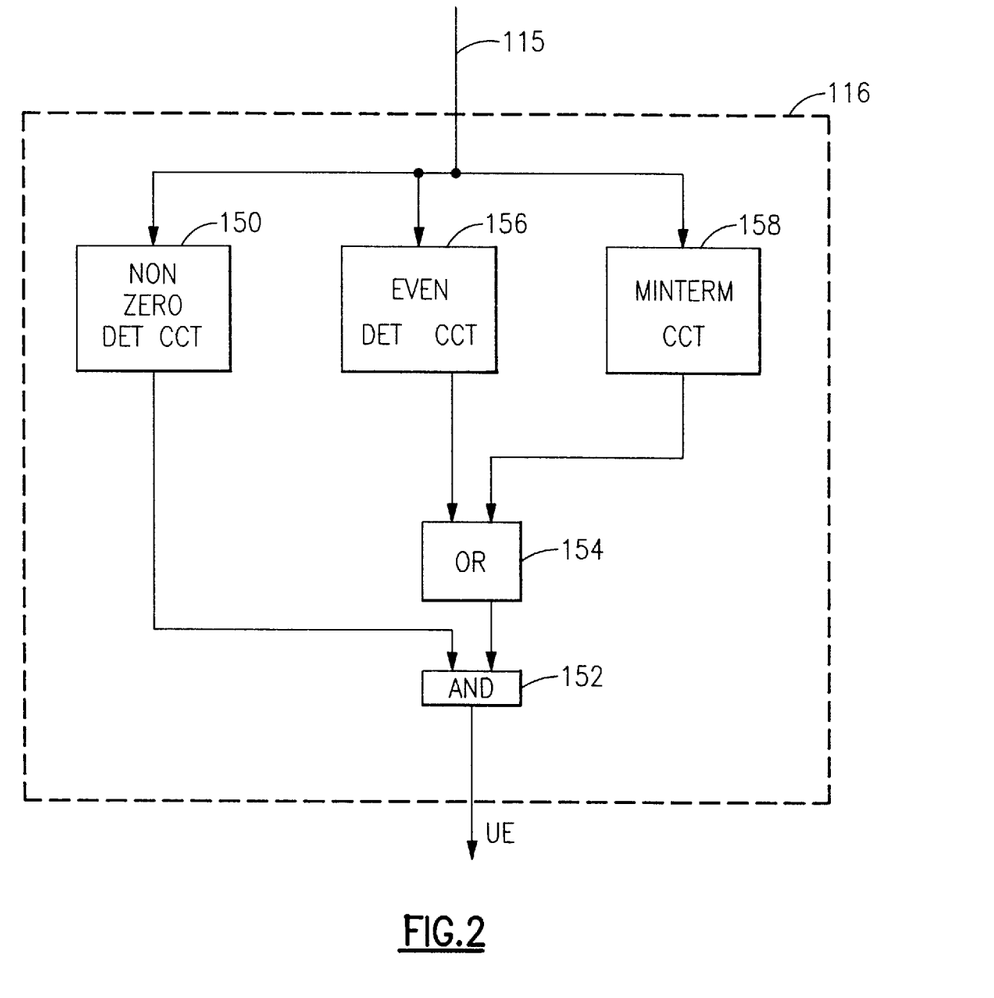
FIG. 2 is a block diagram representation of an uncorrectable-error detection circuit in the circuit of FIG. 1.

FIG. 2 is a block diagram representation of the UE detection circuit 116 of FIG. 1. The circuit detects whether an uncorrectable error (e.g. a double error) has occurred in a data word read from memory. In the present embodiment, the all zero syndrome has been reserved to indicate that no error has been detected. Therefore, the UE detect circuit 116 provides an output only when the syndrome is not all zeros. Furthermore, the UE detect circuit 116 generates an output only when the syndrome being analyzed does not correspond to one of the correctable-error syndromes defined in the H-matrix. An inspection of the H-matrix of Table A indicates that all correctable-error syndromes contain an odd number of ones. Therefore, a syndrome containing an even number of ones, other than 0, represents an uncorrectable error. Furthermore, all remaining syndromes not identified in the H-matrix also represent multiple errors. The UE detect circuit 116, as shown in FIG. 2, includes a non-zero detect circuit 150 having an output which is ANDed by means of AND circuit 152 with the output of OR gate 154. OR gate 154 receives an input from an EVEN detect circuit 156 which provides an output when the number of ones in the syndrome is an even number. A minterm circuit 158 provides an output for all syndromes having an odd number of ones and not contained in the H-matrix. The outputs of the EVEN detect circuit 156 and the minterm circuit 158 are connected as inputs to the OR gate 154. The minterm circuit 158 may also provide an output for certain even syndromes having an even number of 1's. However, even syndromes represent logical don't care states since all even syndromes are detected by the EVEN detect circuit 156. Advantageously, the even syndromes may be used as don't care conditions in the minterm circuit to reduce the number of logic gates required for that circuit.

TABLE B

| 0 | 1 | 2 | 3 | 4 | 5 | 6 | 7 |
|---|---|---|---|---|---|---|---|
| 1 | 1 | 1 | 1 | — | — | — | — |
| 1 | 0 | 1 | 0 | — | — | — | — |
| 0 | 1 | 0 | 1 | — | — | — | — |
| — | — | — | — | 1 | 1 | 1 | 1 |
| — | — | — | — | 1 | 0 | 1 | 0 |
| — | — | — | — | 0 | 1 | 0 | 1 |
| 1 | — | 1 | — | 0 | — | 0 | — |
| — | 1 | — | 1 | — | 0 | — | 0 |
| 0 | — | 0 | — | 1 | — | 1 | — |
| — | 0 | — | 0 | — | 1 | — | 1 |

The minterm circuit 158 is essentially a decoder circuit which provides an output for all syndromes having an odd number of ones and not contained in the H-matrix. Since an 8 bit word is used for syndrome generation, a total of 256 possible terms may be defined. Only 72 of those are defined in the H-matrix. However, because of the particular structure of the H-matrix the remainder of the terms may be reduced to a set of minterms, as shown in table B. It will be apparent from an inspection of the H-matrix that bits 0–3 of the 72 8-bit syndromes defined in the H-Matrix do not use the code 1111, or the code 1010, or the code 0101. Therefore, these codes in bits 0–3 define an uncorrectable error independent of the states of bits 4–7 of the syndrome. Similarly, it may be determined that the codes 1111, 1010 and 0101 are not used in bits 4–7. Accordingly, these codes represent uncorrectable errors independent of the states of the associated bits 0–3. It may be similarly determined that the codes shown in table B, with the don't care states represented by dashes in table B, all define syndromes representing an error condition. It can be shown that the terms of Table B define all uncorrectable-errors syndromes having an odd number of ones and same, but not necessarily all, syndromes having an even number of ones. The even syndromes are detected by EVEN detect circuit 156. It will be apparent that the decoder circuit 158 will require only ten 4-input AND gates and a 10-input OR gate, or the equivalent, for implementation of the terms of Table B. This is a large savings of gates over a direct decoding of all terms which are not part of the H-matrix. The non-zero detect circuit 150 of FIG. 2 may be simply an 8-input OR gate which provides an output when the 8-bit input word is not all zeros. The EVEN detect circuit 156 may be constructed in a standard fashion from a number of XNOR gates. The OR gate 154 and AND gate 152 are standard logic gates.

The CE detect circuit 118 of FIG. 1 provides an output when a correctable error has been found and is assumed to have been corrected. From an analysis of the H-matrix it is apparent that the syndromes corresponding to data bit positions 0 through 7 have identical codes in the first four bit positions and differ only in the second four bit positions. Thus, a single decode of the four bit word represented by 1100 identifies the first group of 8 syndromes. Similarly, the bits of the second group of eight bits all have an associated syndrome in which the first four bits are 0110. The third group of eight bits has the code 0011 in common and the fourth group of eight bits has the code 1001 in common. This pattern is repeated for bits 4 through 7 of the next four groups of eight bits beginning at bit 33 of the 64 bit word. A further observation to be made is that the bit pattern of bits 4 through 7 of the first, second, third and fourth bytes, counting from bit 0 are identical in a similar fashion. The bit patterns for the fifth, sixth, seventh and eighth bytes, i.e. from bit 33 through 63 have the same bit pattern as well.

Figure 3:
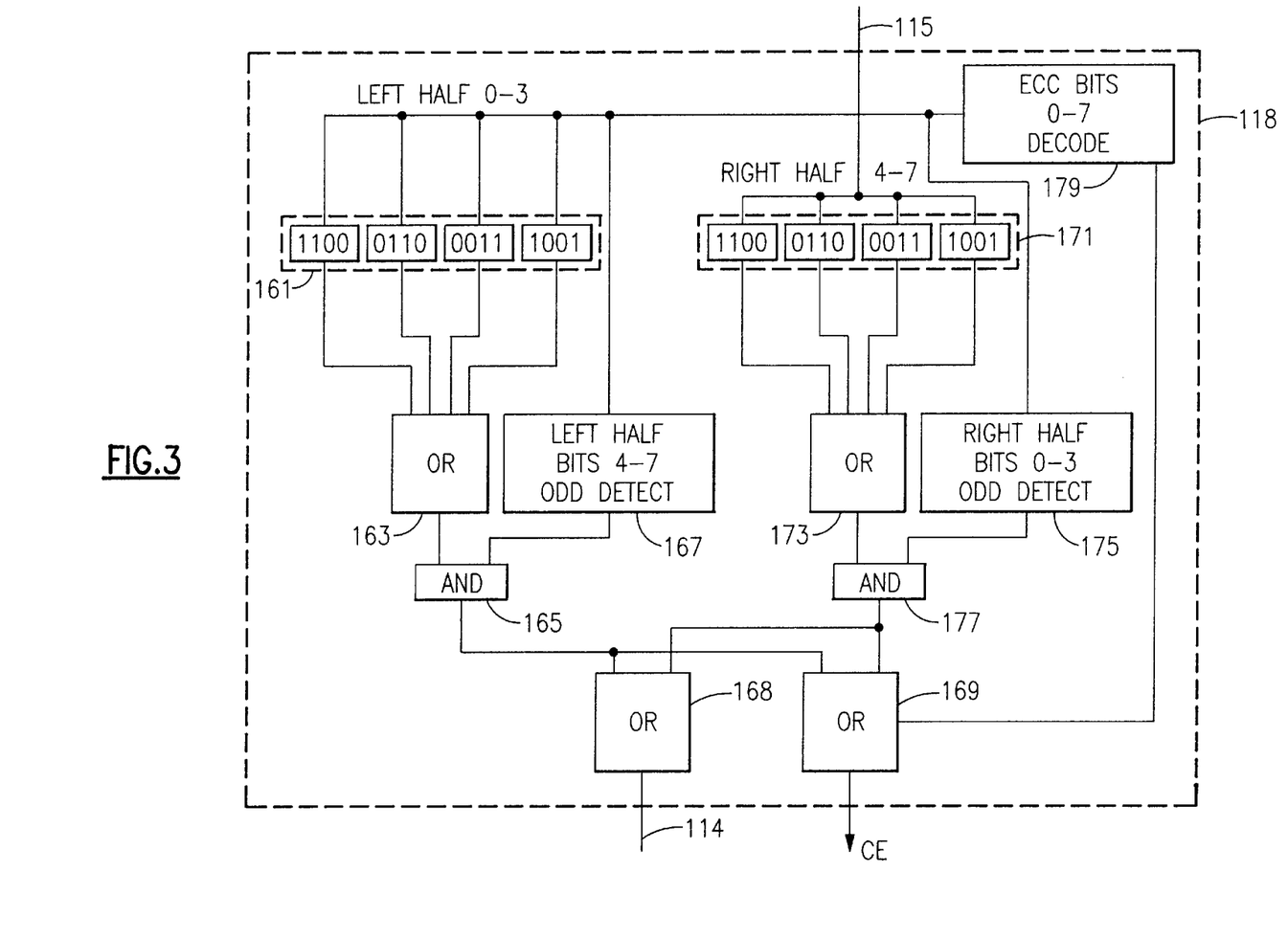
FIG. 3 is a block diagram representation of a correctable-error detection circuit in the circuit of FIG. 1.

FIG. 3 is a block diagram representation of an implementation of the CE detect circuit 118 of FIG. 1. The presence of a corrected error may also be obtained from the output of the flip logic 120. However, since there is necessarily an output for each of the 64 data bits and the 8 ECC bits the detection of a correctable error from that circuitry would require a large number of logic gates and a substantial delay. The circuit of FIG. 3 uses considerably fewer logic gates. Specifically, the circuit of FIG. 3, by means of four 4-input AND gates 161 and an OR gate 163, indicates whether the first four bits of an 8-bit error syndrome matches one of the correctable-error syndromes for bit positions 0 through 31 of the 64-bit data word. The circuit 161 detects the presence of the four possible bit combinations of bits 0 through 3 syndromes corresponding to bit positions 0 through 31 of the H-matrix of Table A. Bits 4 through 7 of the syndrome are decoded by a detect circuit 167 which detects the presence of an odd number of 1's in bits 4 through 7. As will be apparent from the H-matrix of Table A, the outputs of circuits 163 and 167 together define the codes which correspond to bit positions 0 through 31 of the data word. The outputs of circuits 163 and 167 are ANDed by means of AND gate 165 to provide a CE output from circuit 118 via OR gate 169 when a correctable error is detected in the left half of the data word. In a similar fashion, the correctable-error codes in the right half of the data word are identified by detecting the presence of one of the four possible combinations in bits 4 through 7 in positions 32 through 63 of the H-matrix, corresponding to bits 32 through 63 of the data word. The circuit for detecting these four possible combinations is shown at 171 and the four outputs of the circuit 171 are ORed in OR gate 173. The presence of an odd number 1's in bits 0 through 3 of the syndrome corresponding to positions 32 through 63 of the matrix is detected by the detect circuit 175. The output of the OR circuit 173 and detect circuit 175 are ANDed by means of AND gate 177 to provide a CE output via OR gate 169. Since the ECC bits are part of the matrix which defines correctable-error codes, the ECC bits are also decoded. Circuit 179 is a standard decode circuit which provides an output when anyone of the eight codes 0 through 7 of the ECC bits is detected. The decode circuit 179 may be implemented using 8-input AND gates. The output of decode circuit 179 is connected to OR gate 169 to provide the CE output indication. OR gate 168 is provided to generate the correctable error indication on conductor 114 when such a condition is detected in the data bits, independent of the condition of the CE bits. As described earlier herein with reference to FIG. 1, the state of conductor 114 is used in detection circuit 139 for cross-checking purposes.

The flip logic in 120 in FIG. 1 operates to "flip" or change the polarity of a particular bit found in error. The flip logic decodes the syndrome and if a particular one of the syndromes in the H-matrix of Table A is found, an output will be generated by the flip logic circuit 120 to flip the particular bit position corresponding to the detected syndrome. The output of the flip logic 120 is used to flip the selected data bit in the data flip logic 123, which corresponds to the data received from the data register 110. The contents of the data flip logic 123 is subsequently stored in the data output register 122. The parity bit may be flipped by means of the flip parity circuit 124 from the flip logic 120 if it appears that the parity bit is in error.

Figure 4:
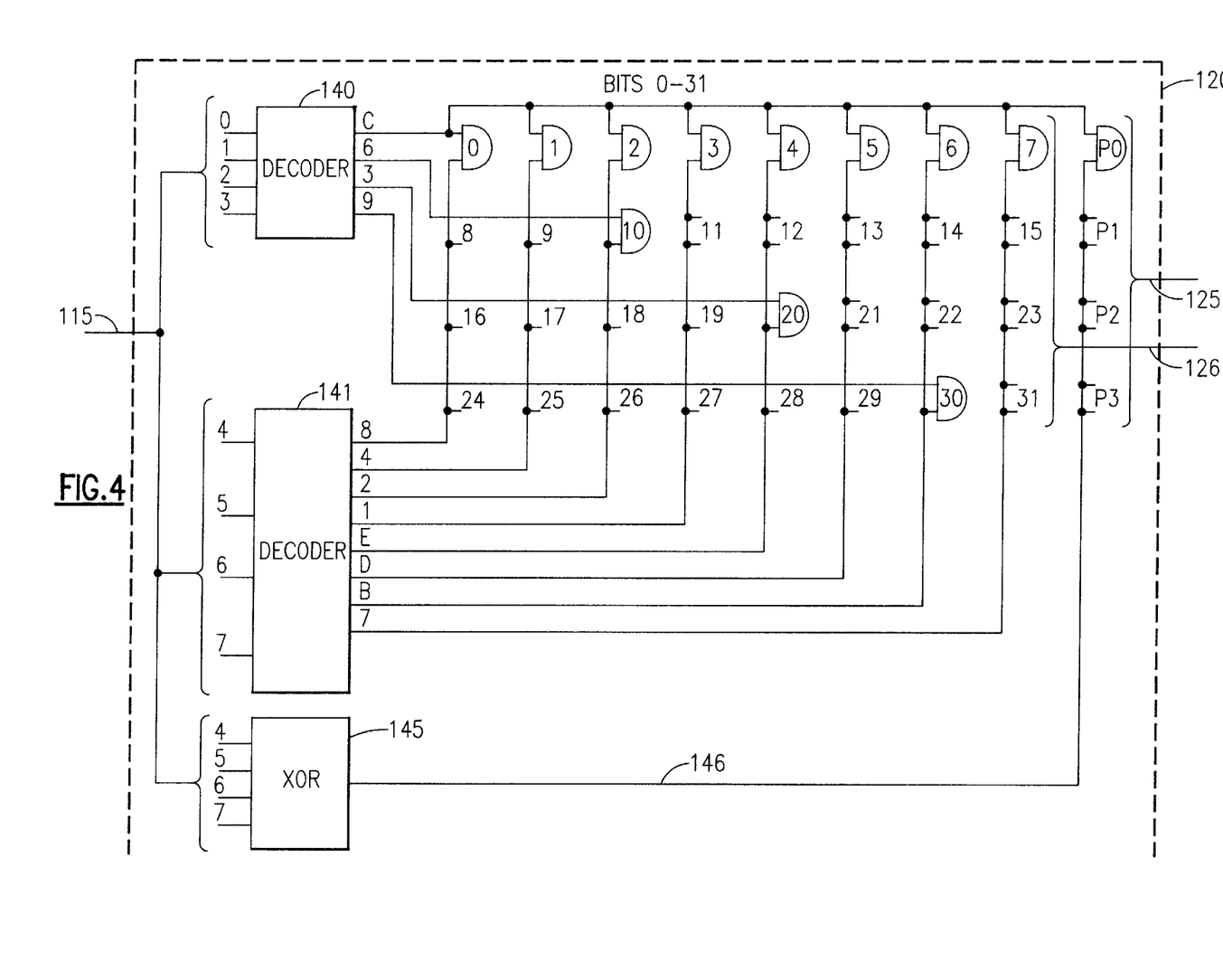
FIG. 4 is a block diagram representation of a part of an error correction circuit shown in FIG. 1.
Figure 5:
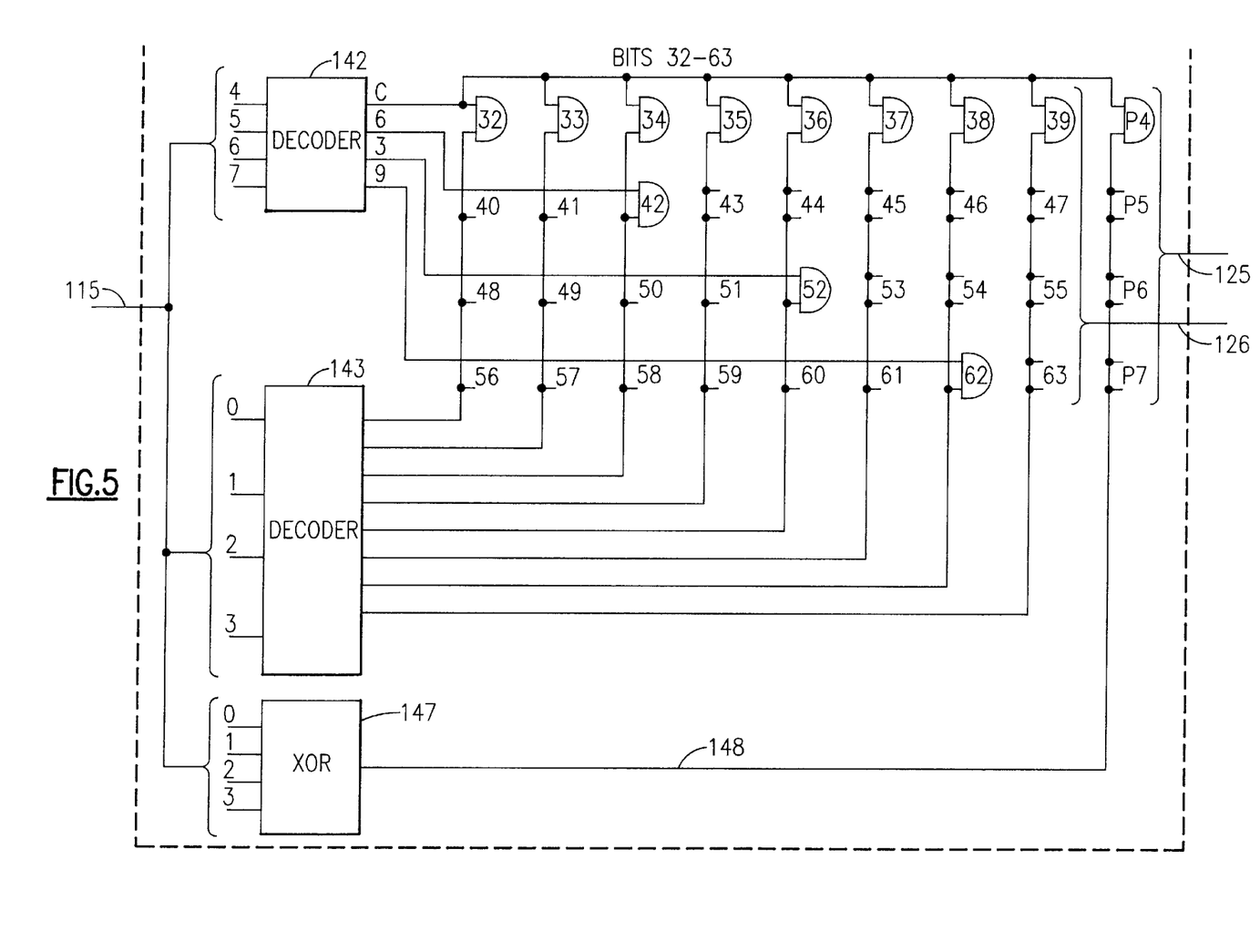
FIG. 5 is a block diagram representation of another part of an error correction circuit shown in FIG. 1.

FIGS. 4 and 5 together are a block diagram representation of an implementation of the flip logic 120, taking a particular advantage of the bit pattern of the H-matrix. As shown in the H-matrix in Table A, and as noted earlier herein, bits 0 through 3 of the first eight columns are identical. Similarly, the bits 0 through 3 of the second, third and fourth group of eight columns are identical for each group of eight. For each of those four groups of eight columns the bit pattern for bits 4, 5, 6 and 7 are identical. Taking advantage of that particular pattern, a unique output is produced for each of the bit positions 0 through 31 of the 64 bit word represented in the matrix by means of a single decoding circuit. The decoding circuit decodes bits 0 through 3 to generate four separate outputs, one for each of the group of eight columns. A single decoder is provided for bits 4 through 7 which provides a single output for each of the eight groups of eight columns. FIG. 4 is a block diagram representation using the two decoders and 32 two-input AND gates to uniquely address one of the 32 bit positions in the first half of the 64-bit data word. As shown in FIG. 4, the decoder 140 decodes bits 0 through 3 of a syndrome corresponding to one of the bits 0 through 32 of the data word by generating outputs corresponding to the hexadecimal values 3, 6, 9 and C (decimal 12). Each one of these outputs corresponds to one of the four left most bytes of the data word. The decoder 141 decodes the bits 4 through 7 of the syndrome to provide the outputs 1, 2, 4, 7, 8, B (decimal 11), D (decimal 13) and E (decimal 14). These values correspond to the values of bits 4 through 7 in each of the bytes of the left half of the data word. It will be immediately apparent from the H-matrix of Table A that the combination of the outputs of decoders 140 and 141 as depicted in FIG. 4 uniquely identifies each of the bits of the left half of the data word. Only a limited number of the AND gates which produce the desired outputs are shown in FIGS. 4 and 5 for the sake of clarity. Each bit position identified by a particular combination of the decoder outputs is indicated in FIGS. 4 and 5. Each of the AND gates represented by the numbers 0 through 31 in FIG. 4 are connected to a plurality of conductors 126 and are used to flip the appropriate data bit in the data flip data logic 123. Bits 4 through 7 of the syndrome on bus 115 are also connected as inputs to a four-input EXCLUSIVE-OR gate 145 to generate an output signal on conductor 146 which is the XOR of the four inputs 4 through 7. Conductor 146 is connected as an input to each of the output AND gates P0 through P3 and is ANDED signals C, 3, 6, and 9 in gates P0 through P3, respectively. The outputs of gates P0 through P3 are provided on conductors 125 and applied to the flip parity circuit 124, the output of which is directly connected to the parity bit position in the data register 122.

FIG. 5 is analogous to FIG. 4 but pertains to bits 32 through 63 of the data word. As mentioned earlier, the pattern of the H-matrix is such that quadrants 1 and 3 and quadrants 2 and 4 of the matrix are identical. FIG. 5 shows a decoder 142 which corresponds to the decoder 140 in FIG. 4 and has for its inputs bits 4, 5, 6 and 7 of the syndrome to generate an output corresponding to each of the right most four bytes, each byte having the identical code in bit positions 4 through 7. Thus, a single 4-output decoder identifies the 4 rows of the matrix for bit positions 32 through 63. The decoder 143 is identical to decoder 141 and is connected to bits 0 through 3 of the syndrome for bit positions 32 through 63. It provides the same outputs as decoder 141 in FIG. 4. Each of the eight outputs of decoder 143 identifies one column in each group of eight columns in the right hand portion of the matrix. The combination of the decoders 142 and 143 uniquely identifies each of the bits 32 through 63. The bit identifying outputs are connected via conductors 126 to the flip logic circuit 120. Outputs corresponding to parity bits 4 through 7 are connected to the flip parity circuit 124 via conductors 125.

Bits 0 through 3 of the syndrome are also connected as inputs to a four-input XOR gate 147 to generate an output signal on conductor 148 which is the XOR of the four inputs 0 through 3. Conductor 148 is connected as an input to each of the output AND gates P4 through P7 and is ANDED with signals C, 6, 3, and 9 in gates P4 through P7, respectively.

It is to be understood that the above-described arrangement is merely illustrative of the application of the principles of the invention, and that other arrangements may be devised by those skilled in the art without departing from the scope of the invention as defined by the appended claims.

What is claimed is:

1. A data processing system comprising a memory storing data words and associated error control codes and a data processor connected to the memory, the data processor comprisig:

a data input register for receiving a data word having a predetermined number of bit positions and an associated error control code from the memory;

a syndrome generator connected to the data input register for generating an error syndrome from each data word and the associated error control code read from memory, each error syndrome being defined in terms of ones and zeroes;

error correction circuitry responsive to an error syndrome belonging to a selected uoup of correctable-error syndromes having predefined combinations of ones and zeros to selectively correct the data word at a selected bit position, the selected group of error svndromes excluding error svndromes having an even number of ones; and an uncorrectable-error detection circuit comprising an even detect circuit for detecting svndromes having an even number of ones, the uncorrectable-error detection circuit responsive to an error syndrome having an even number of ones to generate an error indication, an error syndrome comprising only zeros being designated as a no-error syndrome;

a zero detect circuit; and an orthogonality detection circuit responsive outputs of the zero detect circuit and the correctable-error detect circuit and the uncorrectable-error detect circuit to generate an error signal if not one and only one of the connected circuits generates an output signal.

2. A data processing system comprising a memory storing data words and associated error control codes and a data processor connected to the memory, the data processor comprising:

a data input register for receiving a data word having a predetermined number of bit positions and an associated error control code from the memory;

a syndrome generator connected to the data input register for generating an error syndrome from each data word and the associated error control code read from memory, each error syndrome being defined in terms of ones and zeroes;

error correction circuitry responsive to an error syndrome belonging to a selected group of correctable-error syndromes having predefined combinations of ones and zeros to selectively correct the data word at a selected bit position, the selected group of error syndromes excluding error syndromes having an even number of ones and defining subsets of correctable-error syndromes, each syndrome of one subset of the correctable-error syndromes having a predefined identical combination of ones and zeros in a first set of corresponding bit positions and differing combinations of ones and zeros comprising an odd number of ones in a second set of corresponding bit positions;

an uncorrectable-error detection circuit comprising an even detect circuit for detecting syndromes having an even number of ones, the uncorrectable-error detection circuit responsive to an error syndrome having an even number of ones to generate an error indication; and a correctable-error detection circuit defining subsets of correctable-error syndromes and each syndrome of one subset of the correctable-error syndromes having a predefined identical combination of ones and zeros in a first set; of corresponding bit positions and differing combinations of ones and zeros comprising an odd number of ones in a second set of corresponding bit positions, the system further comprising a correctable-error detection circuit connected to the syndrome generator, the correctable-error detection circuit comprising first decode circuitry for detecting the predefined identical combination of ones and zeros in the one subset of corresponding bit positions and second decode circuitry for detecting on odd number of ones in the other bit positions.

3. The system in accordance with claim 2 wherein each syndrome of an other subset of correctable-error syndromes has a predefined identical combination of ones and zeros in the second set of corresponding bit positions and differing combinations of ones and zeros comprising an odd number of ones in the first set of corresponding bit positions and wherein the correctable-error detection circuit further comprises a third decode circuit for detecting the predefined identical combination of ones and zeros in the second set of corresponding bit positions and a fourth decode circuit for detecting an odd number of ones in the first set of corresponding bit positions.

4. The system in accordance with claim 2 wherein the correctable error detect circuit further comprises a plurality of logic gates for logically combining each of the outputs of the first decoder circuitry with each of the outputs of the second decoder circuitry.

5. A data processing system comprising a memory storing data words and associated error control codes and a data processor connected to the memory, the data processor comprising:

a data input register for receiving a data word having a predetermined number of bit positions and an associated error control code from the memory;

a syndrome generator for generating error syndromes from received data words and associated error control codes of data words received in the data input register;

the error syndromes including correctable-error syndromes and all syndromes of one subset of the correctable-error syndromes have a predefined identical same combination of ones and zeros in a first set of corresponding bit positions and differing combinations of ones and zeros in a second set of corresponding bit positions;

error correction circuitry connected to the syndrome generator and responsive to a correctable-error syndrome to correct a received data word at a selected bit position of the received data word defined by the error syndrome;

the error correction circuitry comprising a plurality of output gates each providing an error correction output signal, and decoder circuitry having inputs connected to the syndrome generator and outputs connected to each of the output gates, the decoder circuitry comprising first decode circuitry operative to decode the predefined identical same combination of ones and zeros in the one subset of corresponding bit positions and second decode circuitry to decode combinations of ones and zeros in the second set of corresponding bit positions.

6. The system in accordance with claim 5 wherein a received data word received in the data input register comprises a parity bit, the system further comprising parity generating circuitry connected to the data input register for generating a parity output representative of parity over a data word and associated error control code received in the data input register and connected to the error correction circuitry and wherein the error correction circuitry is further responsive to correctable-error syndromes and the parity output to selective modify the parity bit of the received data word.

7. The system in accordance with claim 5 and further comprising a plurality of logic gates for logically combining each of the outputs of the first decode circuitry with each of the outputs of the second decode circuitry.

8. The system in accordance with claim 5 wherein each syndrome of an other subset of correctable-error syndromes has a predefined identical combination of ones and zeros in the second set of corresponding bit positions and differing combinations of ones and zeros in the first set of corresponding bit positions and wherein the error correction circuit further comprises a third decode circuit for decoding the predefined identical combination of ones and zeros in the second set of corresponding bit positions and a fourth decode circuit for decoding ones and zeros in the first set of corresponding bit positions.

9. The system in accordance with claim 8 and further comprising bit polarity determination circuitry connected to the syndrome generator and responsive to a predefined bit polarity condition of a generated syndrome to generate an error signal.

10. In a data processor receiving a data word and associated error control codes from a memory, a method of correcting single errors, the method comprising the steps of:

defining a set of correctable-error syndromes such that the correctable-error syndromes have a predefined combination of ones and zeros in a first set of corresponding bit positions and differing combinations of ones and zeros comprising an odd number of ones in a second set of corresponding bit positions;

decoding the predefined combination of ones and zeros in the first set of corresponding bit positions and detecting an odd number of ones in the second set of bit positions to detect the presence of correctable errors; and selectively combining the result of the step of decoding and the result of the step of detecting to generate an error correction output signal.

11. The method in accordance with claim 10 wherein the step of defining a set of correctable-error syndromes further comprises defining an other subset of correctable-error syndromes having a predefined combination of ones and zeros in the second set of corresponding bit positions and differing combinations of ones and zeros comprising an odd number of ones in the first set of corresponding bit positions and wherein the step of detecting correctable errors further comprises the step of decoding the predefined combination of ones and zeros in the second set of corresponding bit positions and the step of detecting an odd number of ones in the first set of corresponding bit positions.

12. This method in accordance with claim 10 wherein the step of detecting correctable-error syndromes comprises defining all correctable error syndromes to have an odd number of ones and further comparing the steps of detecting uncorrectable errors by detecting syndromes having an even number of zeros and the step of detecting a predetermined set of syndromes having combinations of ones and zeros other than the predefined combinations of ones and zeros in the first set of corresponding bit positions and detecting syndromes having a odd number of ones and not included in the set of correctable-error syndromes and not included in the predetermined set of syndromes.

* * * * *